US011183425B2

(12) United States Patent
Furutani

(10) Patent No.: US 11,183,425 B2
(45) Date of Patent: Nov. 23, 2021

(54) METHOD OF MANUFACTURING SEMICONDUCTOR DEVICE AND METHOD OF LAMINATING METAL

(71) Applicants: Kabushiki Kaisha Toshiba, Tokyo (JP); Toshiba Electronic Devices & Storage Corporation, Tokyo (JP)

(72) Inventor: Kengo Furutani, Kanazawa Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/803,524

(22) Filed: Feb. 27, 2020

(65) Prior Publication Data

US 2021/0020504 A1 Jan. 21, 2021

(30) Foreign Application Priority Data

Jul. 16, 2019 (JP) .............................. JP2019-131287

(51) Int. Cl.
*H01L 21/00* (2006.01)
*H01L 21/768* (2006.01)
*C23C 18/42* (2006.01)
*H01L 21/02* (2006.01)

(52) U.S. Cl.
CPC ........ *H01L 21/76874* (2013.01); *C23C 18/42* (2013.01); *H01L 21/02581* (2013.01); *H01L 21/76855* (2013.01)

(58) Field of Classification Search
None
See application file for complete search history.

(56) References Cited

U.S. PATENT DOCUMENTS

| 2006/0062978 A1* | 3/2006 | Yotsuya | .................. | H05K 3/143 |
|---|---|---|---|---|
| | | | | 428/209 |
| 2010/0183898 A1* | 7/2010 | Imai | .......................... | C25D 5/50 |
| | | | | 428/672 |
| 2010/0240213 A1* | 9/2010 | Urano | ............... | H01L 29/66712 |
| | | | | 438/652 |

(Continued)

FOREIGN PATENT DOCUMENTS

| JP | H10-242205 A | 9/1998 |
|---|---|---|
| JP | 2013-4781 A | 1/2013 |
| JP | 2018-81982 A | 5/2018 |

(Continued)

*Primary Examiner* — Reema Patel
(74) *Attorney, Agent, or Firm* — Allen & Overy, LLP

(57) ABSTRACT

A semiconductor device includes a semiconductor part; an electrode selectively provided on the semiconductor part, the electrode being electrically connected to the semiconductor part; and multiple metal layers provided on the electrode. A method of manufacturing the semiconductor device includes selectively forming a first metal layer on the electrode; forming a palladium layer on the first metal layer, the palladium layer covering the first metal layer; forming a second metal layer on the palladium layer, the second metal layer covering the palladium layer; and forming a gold layer directly on the palladium layer by replacing the second metal layer with the gold layer.

11 Claims, 4 Drawing Sheets

(56) References Cited

U.S. PATENT DOCUMENTS

2011/0027987 A1* 2/2011 Takahashi ........... C23C 18/1632
                                                                      438/652
2018/0138136 A1 5/2018 Tonegawa

FOREIGN PATENT DOCUMENTS

| JP | 2018-147967 A | 9/2018 |
|---|---|---|
| JP | 6385921 B2 | 9/2018 |

* cited by examiner

METHOD OF MANUFACTURING SEMICONDUCTOR DEVICE AND METHOD OF LAMINATING METAL

CROSS-REFERENCE TO RELATED APPLICATIONS

This application is based upon and claims the benefit of priority from Japanese Patent Application No. 2019-131287, filed on Jul. 16, 2019; the entire contents of which are incorporated herein by reference.

FIELD

Embodiments relate to a method of manufacturing a semiconductor device and a method of laminating metal.

BACKGROUND

In a manufacturing process of a semiconductor device, a thick metal layer such as a bonding pad is formed using an electroless plating method. There is the case where a gold layer is formed on a palladium layer using the electroless plating method. The deposition rate of the gold layer, however, is slower as the palladium layer is thicker. Thus, the manufacturing efficiency is reduced by the electroless plating time prolonged to obtain a gold layer with a predetermined thickness on the thick palladium layer.

DETAILED DESCRIPTION

Figure 1:
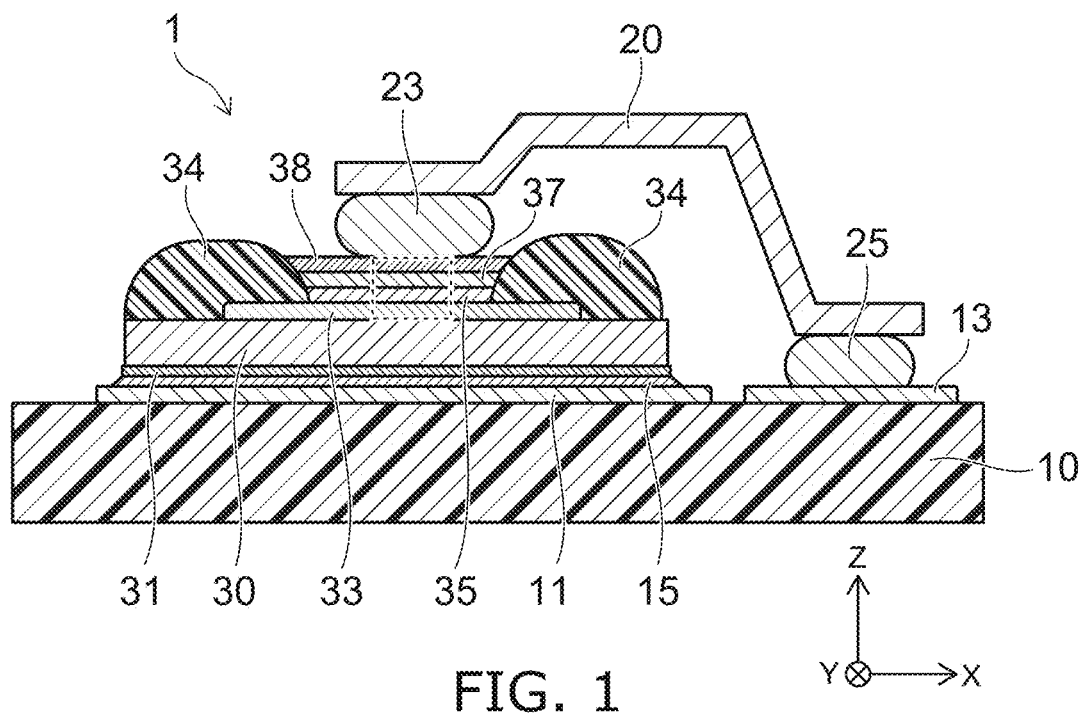
FIG. 1 is a schematic cross-sectional view showing a semiconductor device according to an embodiment.

According to one embodiment, a semiconductor device includes a semiconductor part; an electrode selectively provided on the semiconductor part, the electrode being electrically connected to the semiconductor part; and multiple metal layers provided on the electrode. A method of manufacturing the semiconductor device includes selectively forming a first metal layer on the electrode; forming a palladium layer on the first metal layer, the palladium layer covering the first metal layer; forming a second metal layer on the palladium layer, the second metal layer covering the palladium layer; and forming a gold layer directly on the palladium layer by replacing the second metal layer with the gold layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. In the example shown in FIG. 1, the semiconductor device 1 is mounted on a printed circuit board 10.

As shown in FIG. 1, the printed circuit board 10 includes a mount pad 11 and an interconnect 13. The mount pad 11 is provided on a front surface of the printed circuit board 10. The semiconductor device 1 is mounted on the mount pad 11 via a connection member 15. The semiconductor device 1 is electrically connected to the interconnect 13 via a connection conductor 20, for example.

The semiconductor device 1 includes a semiconductor part 30, an electrode 31, an electrode 33, an insulating layer 34, and metal layers 35, 37 and 38. The semiconductor device 1 is, for example, an IGBT (Insulated Gate Bipolar Transistor). The electrode 31 is, for example, a collector. The electrode 33 is, for example, an emitter. The semiconductor part 30 is, for example, silicon.

The electrode 31 is provided on the back-surface of the semiconductor part 30. The electrode 31 is electrically connected to the mount pad 11 via the connection member 15.

The mount pad 11 is, for example, a metal plate including copper or copper alloy. The connection member 15 is, for example, a solder.

The electrode 33 is provided on the front surface of the semiconductor part 30. The insulating layer 34 is provided to cover the periphery of the electrode 33. The insulating layer 34 includes, for example, insulative resin such as polyimide. The electrode 33 has an exposed surface surrounded by the insulating layer 34. The metal layer 35 is selectively provided on the exposed surface of the electrode 33. The metal layer 37 is provided to cover the metal layer 35 surrounded by the insulating layer 34. The metal layer 38 is provided to cover the metal layer 37 surrounded by the insulating layer 34.

The connection conductor 20 is bonded on the metal layer 38 via a connection member 23. The connection conductor 20 is, for example, a plate-like connector including copper or copper ahoy. The connection member 23 is, for example, a solder. Moreover, the connection conductor 20 is bonded to the interconnect 13 via the connection member 25. The connection member 25 is, for example, a solder.

The semiconductor device 1 is not limited to the above example. For example, the semiconductor device 1 may be a MOSFET or a diode. In place of the printed circuit board 10, a lead frame or the like may be used when mounting the semiconductor device 1.

Figure 2:
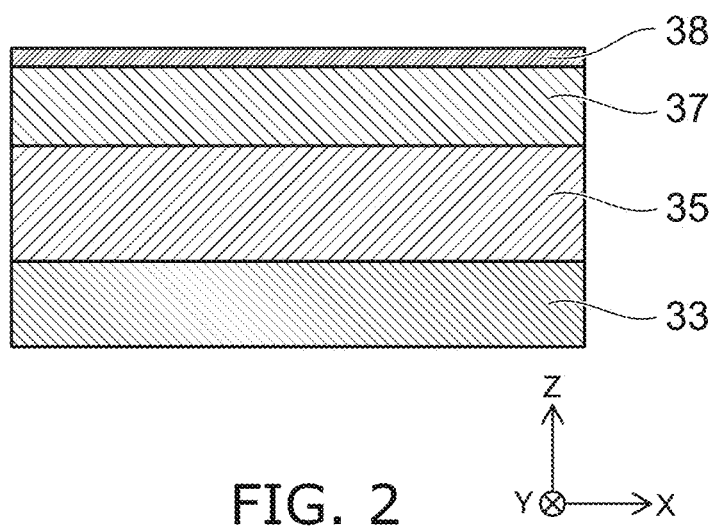
FIG. 2 is a schematic cross-sectional view showing an electrode structure of the semiconductor device according to the embodiment.

FIG. 2 is a schematic cross-sectional view showing an electrode structure of the semiconductor device 1 according to the embodiment. FIG. 2 shows a region surrounded by a broken line in FIG. 1.

The semiconductor device 1 includes, for example, metal layers 35, 37 and 38 stacked on the electrode 33. The electrode 33 is, for example, an aluminum layer. The electrode 33 may be a metal layer including copper. The metal layer 35 is, for example, a nickel layer. The metal layer 37 is, for example, a palladium layer. The metal layer 38 is, for example, a gold (Au) layer.

The metal layer 37 serves as, for example, a barrier layer. The metal layer 37 prevents nickel in the metal layer 35 from being diffused into the metal layer 38. Thereby, it is possible to prevent the metal layer 38 from being altered in composition. That is, when the metal layer 37 is not provided, nickel in the metal layer 35 is diffused into the metal layer 38, making the metal layer 38, for example, a gold layer including nickel. For example, comparing with the metal layer 38 not including nickel, the connection strength may be reduced between the metal layer 38 and the connection member 23 (see FIG. 1).

Figure 3A:
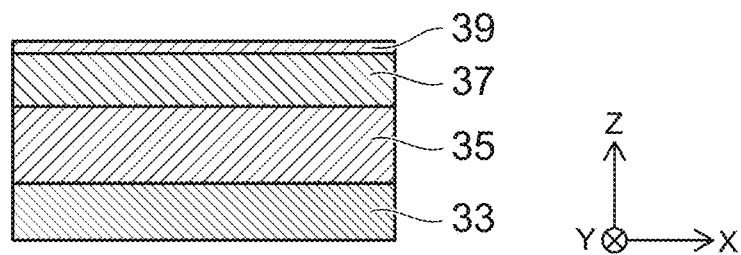
FIGS. 3A to 3C are schematic cross-sectional views showing a manufacturing process of the semiconductor device according to the embodiment.
Figure 3B:
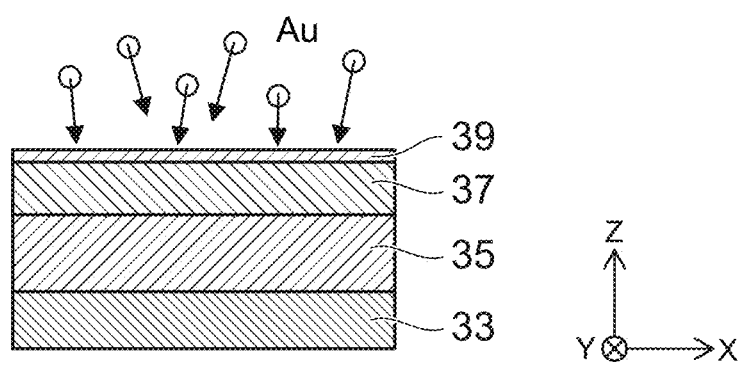
Figure 3C:
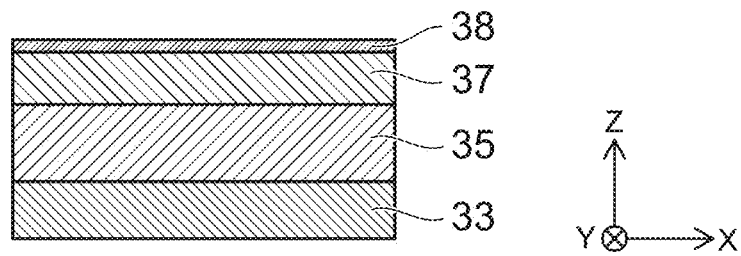

FIGS. 3A to 3C are schematic cross-sectional views showing a manufacturing process of the semiconductor device 1 according to the embodiment. FIGS. 3A to 3C are schematic views showing a process of forming the metal layers 35, 37, and 38 on the electrode 33.

As shown in FIG. 3A, the metal layers 35, 37 and 39 are formed in order on an electrode 33 which serves as a base layer. The electrode 33 includes, for example, aluminum or aluminum alloy at the front surface side thereof.

The metal layer 35 includes, for example, nickel as the main component. The metal layer 35 is formed using, for example, an electroless plating method. The metal layer 35 is not limited to this example, and may be any metal layer that can be bonded to the electrode 33 with a predetermined adhesion strength.

The metal layer 37 includes, for example, palladium (Pd) as the main component. The metal layer 37 is formed to have a thickness, for example, greater than 0.3 μm for exhibiting the significant effect as a barrier layer. The metal layer 37 is formed to cover the metal layer 35 by, for example, an electroless plating method.

The metal layer 39 includes, for example, nickel as the main component. The metal layer 39 is formed to cover the metal layer 37 by, for example, an electroless plating method. The metal layer 39 has a layer thickness of, for example, several dozen nanometers.

In the process shown in FIG. 3B, the metal layers 35, 37 and 39 stacked on the electrode 33 are immersed in a gold plating solution for electroless plating. Thus, nickel atoms in the metal layer 39 are replaced by gold atoms in the gold plating solution, and the nickel atoms are eluted in the gold plating solution. Accordingly, gold atoms are deposited on the metal layer 39. This reaction continues, for example, until all of nickel atoms included in the metal layer 39 are replaced with gold atoms.

As shown in FIG. 3C, the metal layer 39 is replaced with a metal layer 38. The metal layer 38 includes gold as the main component. As a result, the metal layer 38 is formed directly on the metal layer 37. That is, the metal layer 39 does not remain between the metal layer 37 and the metal layer 38. Therefore, nickel is not diffused into the metal layer 38 during the heat treatment after the metal layer 38 is formed, and thereby, it is possible to prevent the adhesion strength of the connection member 23 and the metal layer 38 (See FIG. 1) from being reduced. Moreover, additional gold is directly deposited on the gold layer when the whole surface of the metal layer 37 is covered with the gold layer. For example, it is possible to form the metal layer 38 with a thickness thicker than the thickness of the metal layer 39 in the stacking direction (Z-direction) of the metal layers 35, 37, and 39.

The metal layer 39 is not limited to the metal layer including nickel as the main component. For example, any metal layer may be used, which can be deposited on the palladium layer and includes a main element capable of being replaced with a gold atom by electroless plating. Moreover, the metal layer 39 may remain between the metal layers 37 and 38 as long as the element included in the metal layer 39 does not alter the composition of the metal layer 38.

Figure 4A:
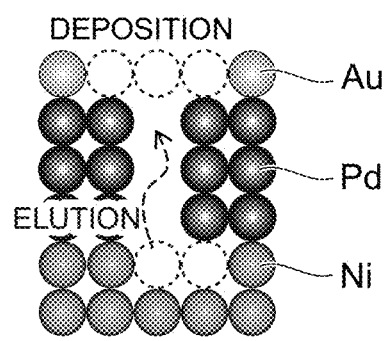
FIGS. 4A and 4B are schematic cross-sectional views showing a manufacturing process of a semiconductor device according to a comparative example.
Figure 4B:
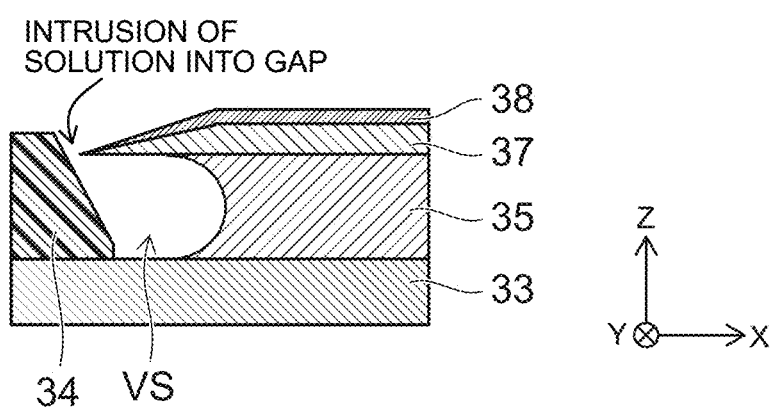

FIGS. 4A and 4B are schematic cross-sectional views showing a manufacturing process of the semiconductor device 1 according to a comparative example, FIG. 4A is a schematic view showing a manufacturing step of depositing gold atoms on a palladium layer formed on a nickel layer. FIG. 4B is a schematic cross-sectional view showing the electrode structure of the semiconductor device 1 according to the comparative example.

For example, it is hard in the electroless plating method to deposit gold atoms by reacting with palladium. That is, the palladium atom is not eluted in the plating solution, and thus, the gold atom is not deposited on the palladium by the reaction between the plating solution and palladium. When the palladium layer has a thickness of about 0.1 μm, for example, gold atoms may be deposited on the palladium layer.

As shown in FIG. 4A, the palladium layer may include a pinhole in the atomic-level structure. The gold plating solution may reach the nickel layer through the pinhole and elutes a nickel atom therein. Thereby, it is possible to deposit the gold atom on the palladium layer.

In contrast, when the palladium layer has a thickness thicker than 0.3 micrometers, the pinhole density may be decreased dramatically in the palladium layer. Therefore, the gold atoms are deposited slowly through the pinholes, and it takes a long time to form the gold plating layer.

Further, as shown in FIG. 4B, when the metal layer 35 and the metal layer 37 are immersed in a plating solution, the plating solution penetrates, for example, through a gap between the insulating layer 34 and the metal layer 37, and nickel in the layer 35 may be replaced. Thus, when the plating is performed for a long time, an unintended cavity VS may be formed by the nickel elution from the metal layer 35. When such a cavity VS is formed, the adhesion strength is reduced between the electrode 33 and the metal layer 35. In addition, the reliability of the semiconductor device 1 may be lowered by the impurity and the like penetrating through the cavity VS.

In the method of manufacturing the semiconductor device 1 according to the embodiment, it is possible to reduce the plating time for forming the metal layer 38 by interposing the metal layer 39, and thereby to improve the manufacturing efficiency of the semiconductor device 1. Moreover, it is possible to suppress the penetration of the plating solution through the gap between the insulating layer 34 and the metal layer 37, and prevent the formation of the cavity VS. Thus, the reliability of the semiconductor device 1 may be improved thereby.

Figure 5A:
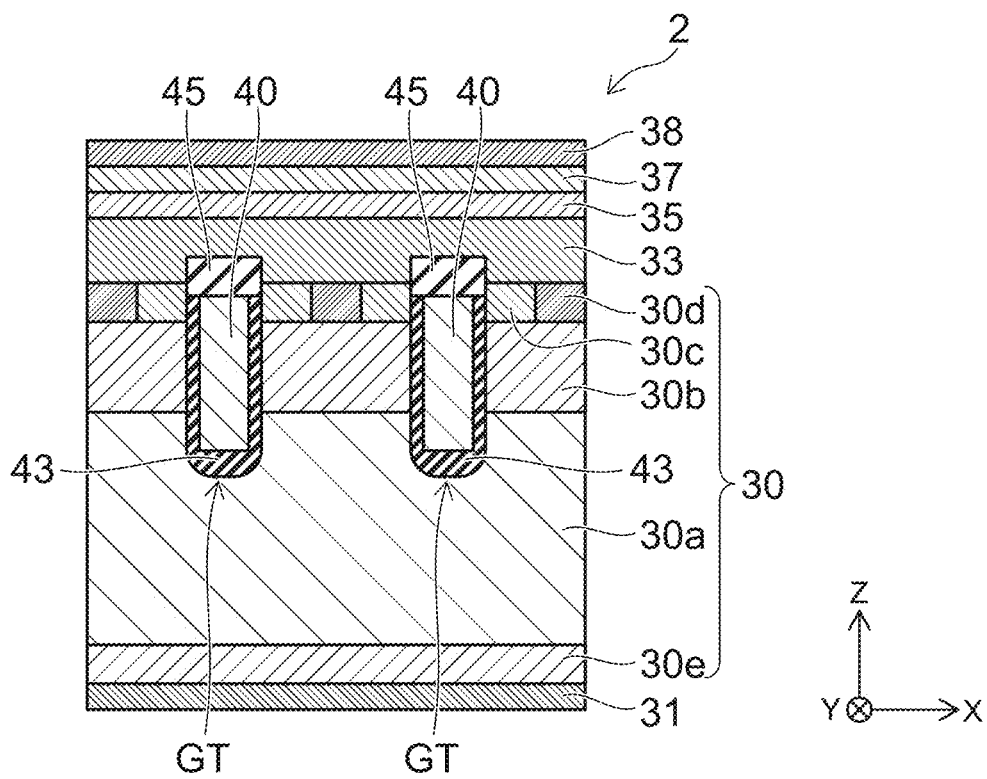
FIGS. 5A and 5B are schematic cross-sectional views showing the structures of the semiconductor device according to the embodiment.
Figure 5B:
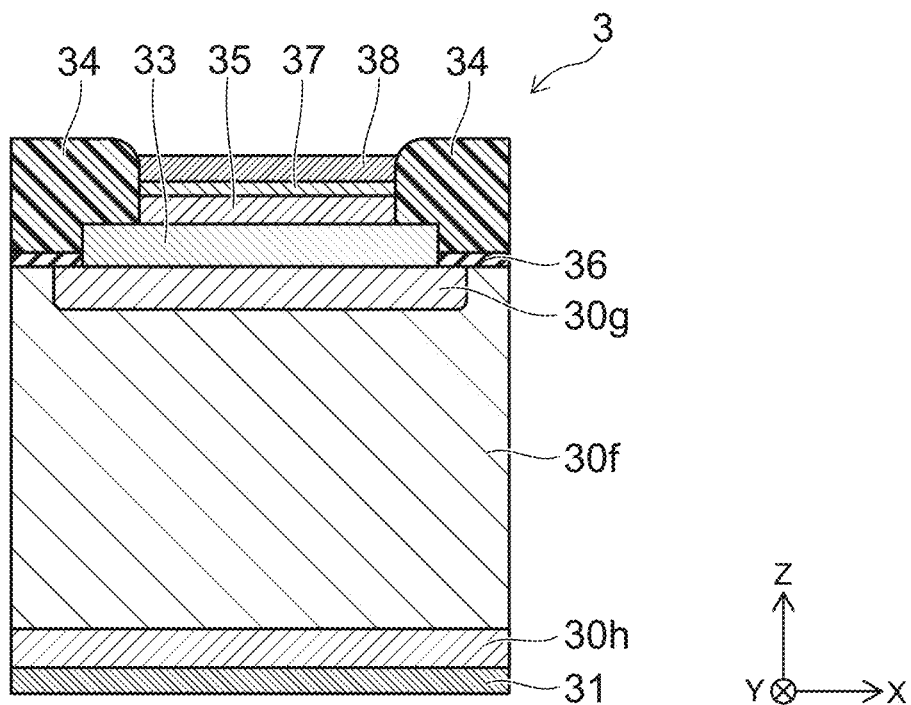

FIGS. 5A and 5B are schematic cross-sectional views showing structures of the semiconductor devices 2 and 3 according to the embodiment. FIG. 5A is a schematic view showing the cross-section of an IGBT having a trench gate structure. FIG. 5B is a schematic view showing the cross-section of a diode.

The semiconductor device 2 shown in FIG. 5A further includes gate electrodes 40. The gate electrodes 40 are provided in gate trenches GT, respectively. The gate electrodes 40 are provided at the front surface side of semiconductor part 30. The gate electrodes 40 are electrically insulated from the semiconductor part 30 by gate insulating films 43, respectively, which cover the inner surfaces of the gate trenches GT. The gate electrode 40 are electrically insulated from the electrode 33 by interlayer insulating films 45.

The semiconductor part 30 includes, for example, an n-type base layer 30a, a p-type base layer 30b, an n-type emitter layer 30c, a p-type contact layer 30d, and a p-type collector layer 30e.

The p-type base layer 30b is provided between the n-type base layer 30a and the electrode 33. The p-type base layer 30b is provided between the adjacent gate electrodes 40.

The n-type emitter layer 30c and the p-type contact layer 30d each are selectively provided between the p-type base layer 30b and the electrode 33. The electrode 33 is in contact with and electrically connected to the n-type emitter layer 30c and the p-type contact layer 30d.

The n-type emitter layer 30c includes an n-type impurity with a concentration higher than the concentration of the n-type impurity in the n-type base layer 30a. The p-type contact layer 30d includes a p-type impurity with a concentration higher than the concentration of the p-type impurities in the p-type base layer 30b. The electrode 33 is electrically connected to the p-type base layer 30b via the p-type contact layer 30d. The p-type collector layer 30e is provided between the n-type base layer 30a and the electrode 31. The electrode 31 is in contact with the p-type collector layer 30e and electrically connected thereto.

In the semiconductor device 3 shown in FIG. 5B, the semiconductor part 30 includes an intrinsic layer 30f, an anode layer 30g, and a cathode layer 30h. The intrinsic layer 30f is, for example, an n-type semiconductor layer including a n-type impurity with the low concentration.

The anode layer 30g is provided between the intrinsic layer 30f and the electrode 33 and selectively provided at the front surface side of the semiconductor part 30. The anode layer 30g is, for example, a p-type semiconductor layer including a p-type impurity. The electrode 33 is in contact with the anode layer 30g and electrically connected thereto.

The cathode layer 30h is provided between the intrinsic layer 30f and the electrode 31. The cathode layer 30h includes a n-type impurity with a concentration higher than the concentration of the n-type impurity in the intrinsic layer 30f. The electrode 31 is electrically connected to the cathode layer 30h.

The semiconductor device 3 further includes an insulating layer 36. The insulating layer 36 is provided between the semiconductor part 30 and the insulating layer 34. For example, a silicon oxide film is used for the insulating layer 36 and serves as a so-called passivation film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method of manufacturing a semiconductor device, the device including a semiconductor part; an electrode selectively provided on the semiconductor part, the electrode being electrically connected to the semiconductor part; and multiple metal layers provided on the electrode,
   the method comprising:
   selectively forming a first metal layer on the electrode;
   forming a palladium layer on the first metal layer, the palladium layer covering the first metal layer;
   forming a second metal layer on the palladium layer, the second metal layer covering the palladium layer; and
   forming a gold layer directly on and in physical contact with the palladium layer by replacing the second metal layer with the gold layer.

2. The method according to claim 1, wherein the first metal layer and the second metal layer include nickel.

3. The method according to claim 1, wherein the gold layer is formed by an electroless plating method.

4. The method according to claim 3, wherein the first metal layer, the palladium layer and the second metal layer each are formed by an electroless plating method.

5. The method according to claim 1, further comprising:
   forming an additional gold layer continuously on the gold layer after replacing the second metal layer.

6. The method according to claim 5, wherein the additional gold layer is formed by an electroless plating method.

7. The method according to claim 1, wherein
   the device further includes an insulating layer at the front surface side of the semiconductor part, the insulating layer covering a periphery of the electrode; and
   the first metal layer, the palladium layer and the gold layer are formed on an exposed region of the electrode surrounded by the insulating layer.

8. A method of laminating metal, the method comprising:
   forming a metal layer on an underlying layer, the metal layer including nickel;
   forming an intermediate layer on the metal layer, the intermediate layer covering the metal layer, the intermediate layer including palladium;
   forming a substitution layer on the intermediate layer, the substitution layer covering the intermediate layer, the substitution layer including nickel; and
   forming a gold layer directly on and in physical contact with the intermediate layer by replacing the nickel in the substitution layer with gold using an electroless plating method.

9. The method according to claim 8, wherein the metal layer, the intermediate layer and the substitution layer each are formed by an electroless plating method.

10. The method according to claim 8, wherein the gold layer is formed by replacing the substitution layer, the gold layer being in contact with the intermediate layer.

11. The method according to claim 8, wherein the gold layer is formed to have a thickness in a stacking direction of the metal layer, the intermediate layer and the substitution layer, the thickness of the gold layer being thicker than a thickness of the substitution layer in the stacking direction.

* * * * *